Oct. 9, 1962 W. W. HAPP 3,058,041

ELECTRICAL COOLING DEVICES

Filed Sept. 12, 1958

INVENTOR

WILLIAM W. HAPP

BY H. Vincent Harsha

ATTORNEY

United States Patent Office 3,058,041 Patented Oct. 9, 1962

3,058,041

ELECTRICAL COOLING DEVICES

William W. Happ, Mountain View, Calif., assignor to Raytheon Company, a corporation of Delaware Filed Sept. 12, 1958, Ser. No. 760,606
3 Claims. (Cl. 317—235)

Figure 1:
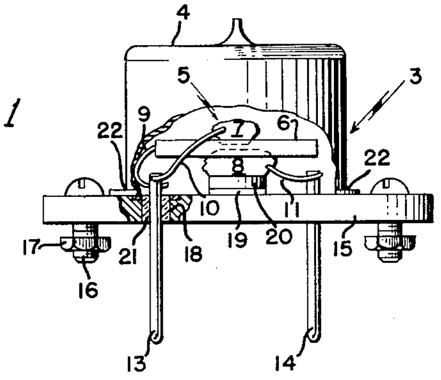

This invention relates generally to means for cooling electrical equipment and, more particularly, to means for cooling semi-conductor devices such as transistors.

One of the problems involved in most electronic equipment wherein relatively large power is being generated lies in the fact that this power generation is generally accompanied by the generation of undesirable heat. A convenient method for evaluating the thermal efficiency of such equipment is to determine the temperature rise that occurs per unit of power being generated. This can be conventionally expressed, for example, in degrees centigrade per watt. It is desirable to reduce this temperature rise as much as possible with the least amount of expense and fabrication difficulties.

Prior to this invention, semi-conductor devices, such as transistors, were provided with a mounting plate made of copper which was directly connected to the device and which acted as a good thermal conductor to carry away heat from the transistor. However, in mounting such devices to a chassis, electrical insulation problems arose. The insulation problem was generally solved by inserting an insulator such as mica between the copper mounting plate and the chassis. When the mounting plate was bolted or screwed on to the chassis, undesirable air gaps existed between the copper plate and the mica and also between the mica and the chassis. These air gaps acted as barriers in the heat conduction path and prevented the heat from being efficiently dissipated. The amount of heat that was dissipated depended largely upon the amount of pressure that was used to hold the plate, mica, and chassis together. Hence, the temperature rise per watt varied considerably according to how tightly the plate was screwed down onto the chassis.

This invention provides an inexpensive and easily fabricated means of cooling and insulating an electronic device that overcomes the air gap difficulty normally encountered. In this invention, a very thin layer of highly adhesive material that has relatively high thermal conductivity and high dielectric strength is provided in the path between the device and the copper mounting plate that is used to mount the device onto the chassis. Such materials as epoxy resins, lacquer, and Duco-Cement, have highly adhesive characteristics as well as good thermal and insulation properties that allow them to be used in this invention. The adhesive characteristics of these materials prevent the presence of air gaps in the thermal conduction path. The barrier formerly arising because of the air gaps is thus greatly reduced. Only a very thin layer of such materials is necessary to provide efficient heat dissipation and good electrical insulation at the voltages involved.

Figure 2:
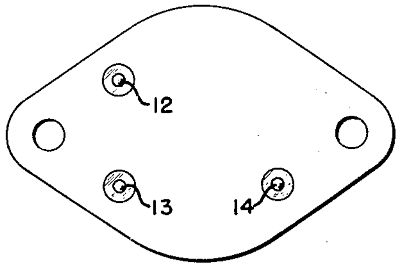

The invention can more easily be described with the help of the drawing in which:

FIG. 1 shows an enlarged pictorial view of a transistor mounting assembly which utilizes an embodiment of the invention; and FIG. 2 shows a view looking at the bottom of the assembly shown in FIG. 1.

In FIG. 1 there is shown a transistor mounting assembly 3 including a copper mounting plate 15 which can be mounted to a chassis by means of screws 16 and nuts 17 in a conventional fashion. Mounted on plate 15 is a thin layer 19 of highly adhesive material, such as lacquer, epoxy resin or Duco-Cement, having relatively high thermal conductivity and high dielectric strength (thereby providing good electrical insulation). Mounted on layer 19 is a copper mounting button 20. Because of the adhesive characteristics of the material used in layer 19 a very close bond exists between mounting plate 15 and layer 19 and between mounting button 20 and layer 19. A transistor 5 is mounted on button 20 in a conventional fashion. Transistor 5 may be comprised of a collector electrode 8 directly contacting button 20, a base electrode 6 and an emitter electrode 7, as in a conventional diffusion type of junction transistor. Leads 9, 10, and 11 are connected from base electrode 6, emitter electrode 7, and collector electrode 8, respectively to terminals 12, 13, and 14, respectively. Terminals 12, 13, and 14 extend through holes in mounting plate 15, one of which is shown in cross-section as hole 18 in FIG. 1. The leads are electrically insulated from mounting plate 15 by means of glass insulators, such as insulator 21. Transistor 5, mounting button 20, and layer 19 are completely enclosed within a cap 4 which is shown partially broken away in FIG. 1. Cap 4 is welded at its rim to mounting plate 15 at points 22, as shown in the figure. FIG. 2 shows the relative positions of the leads, looking at the underside of the assembly shown in FIG. 1, the screws and nuts having been removed.

The mounting assembly shown in the figures provides a very good thermal path for the heat generated within transistor 5 from collector electrode 8 to mounting plate 15. The heat flow throughout this path can be expressed according to the following equation:

$$\frac{\Delta Q}{\Delta T}=K_1\frac{A_1}{L_1}+K_2\frac{A_2}{L_2}+K_3\frac{A_3}{L_3}+K_4\frac{A_4}{L_4}$$

in which:

$\Delta Q$ is heat which flows in calories per second;

$\Delta T$ is temperature difference between base electrode 6 and mounting plate 15;

$A_1$, $A_2$, $A_3$, and $A_4$, are the cross sectional areas of emitter electrode 8, button 20, layer 19 and plate 15, respectively;

$L_1$, $L_2$, $L_3$, $L_4$, are the lengths of the heat paths through emitter electrode 8, button 20, layer 19 and plate 15, respectively; and $K_1$, $K_2$, $K_3$, and $K_4$ are the thermal conductivites of emitter electrode 8, button 20, layer 19 and plate 15, respectively.

Thus, it can be seen that good heat flow requires relatively large cross sectional areas. Such areas are partially limited by the transistor size and the desire to keep the overall dimensions of the electronic component involved as small as possible. It can be further seen that good heat flow requires very short lengths of path, L. It has been found that the length of path through layer 19 can be reduced to approximately .001 inch without reducing the effective electric insulation necessary to prevent current from conducting across the layer due to a voltage applied across the layer. The invention thereby takes advantage of the adhesive qualities of the materials used for layer 19 to provide a short and efficient heat path without voltage breakdown.

It is not to be construed that the embodiment shown in the figures represents the only embodiment of this invention. For instance, the copper button 20 may be directly in contact with either the base or the emitter electrode. The layer of adhesive material may be used to directly contact the electrodes of the transistor or used at some other convenient point in the heat conduction path. The invention may be used with devices other than transistors, if it is borne in mind that the width of the layer is dependent upon the amount of voltage which may exist across the layer. The invention may be used with mica or other non-adhesive materials if the non-adhesive material is bonded within the heat path by means of the highly adhesive materials so as to prevent the existence of air gap barriers. Accordingly, it is desired that the invention not be limited by the details of the path embodiment described herein except as defined by the appended claims.

What is claimed is:

1. In combination, a semi-conductor device, a heat sink comprising a mounting plate for mounting said device, a layer of material having high thermal conductivity, high dielectric strength, and adhesive characteristics bonded to an electrode of said device having the highest heat generating capability and to said mounting plate whereby a thermal path is provided between said device and said plate.

2. In combination, a transistor, a mounting button having high thermal conductivity, means for mounting one electrode of said transistor on said mounting button, said one electrode having the highest heat generating capability a heat sink comprising a mounting plate for mounting said transistor, a thin layer of material having high thermal conductivity, high dielectric strength, and highly adhesive characteristics bonded to said mounting button and to said mounting plate whereby a thermal path is provided through said mounting button and said layer to said mounting plate for dissipating heat from said transistor.

3. In combination, a transistor having an emitter electrode, a base electrode, and a collector electrode, a mounting button having high thermal conductivity, means for mounting said collector electrode on said mounting button, a heat sink comprising a mounting plate for mounting said transistor, a thin layer of material having high thermal conductivity, high dielectric strength, and highly adhesive characteristics bonded to said mounting button and to said mounting plate whereby a thermal path is provided from said collector electrode through said mounting button and said layer to said mounting plate for dissipating heat from said transistor.

References Cited in the file of this patent

UNITED STATES PATENTS

| | | |
|---|---|---|
| 2,529,279 | Breisch | Nov. 7, 1950 |
| 2,725,505 | Webster et al. | Nov. 29, 1955 |
| 2,759,133 | Mueller | Aug. 14, 1956 |
| 2,799,793 | De Cain | July 16, 1957 |
| 2,817,048 | Thuermel et al. | Dec. 17, 1957 |
| 2,825,014 | Willemse | Feb. 25, 1958 |
| 2,887,628 | Zierdt | May 19, 1959 |
| 2,922,935 | Dolder | Jan. 26, 1960 |